United States Patent [19]

Allaire

[11] Patent Number: 5,474,618
[45] Date of Patent: Dec. 12, 1995

[54] PROTECTIVE CERAMIC DEVICE FOR IMMERSION PYROMETER

[75] Inventor: Claude Allaire, St. Eustache, Canada

[73] Assignee: RDC Controle Ltee, Blainville, Canada

[21] Appl. No.: 229,681

[22] Filed: Apr. 19, 1994

[51] Int. Cl.$^6$ .................................................. H01L 35/02
[52] U.S. Cl. .................. 136/234; 136/201; 136/230; 374/139; 374/179; 374/208
[58] Field of Search ..................................... 136/201, 230, 136/232, 233, 234, 231, 242; 374/179, 208, 139, 140

[56] References Cited

U.S. PATENT DOCUMENTS

| | | | |
|---|---|---|---|
| 3,379,578 | 4/1968 | McTaggart et al. | 136/234 |
| 3,468,780 | 9/1969 | Fischer | 204/195 |
| 3,473,968 | 10/1969 | Rinesch et al. | 136/230 |
| 3,539,400 | 11/1970 | Pustell | 136/233 |
| 3,647,558 | 3/1972 | McMurtry | 136/234 |
| 4,060,095 | 11/1977 | Kurita | 136/234 |
| 4,590,326 | 5/1986 | Woldy et al. | 136/233 |
| 4,663,205 | 5/1987 | Hayashi et al. | 428/36 |
| 4,721,533 | 1/1988 | Phillippi et al. | 136/234 |
| 4,749,416 | 6/1988 | Greenspan | 136/232 |
| 5,181,779 | 1/1993 | Shia et al. | 374/139 |
| 5,209,571 | 5/1993 | Kendall | 374/139 |
| 5,308,044 | 5/1994 | Nakashima et al. | 266/88 |

FOREIGN PATENT DOCUMENTS

0543081A1 5/1993 European Pat. Off. .
2180398 3/1987 United Kingdom .

OTHER PUBLICATIONS

Cheng et al—Evaluation of the Continuous Hot Metal Temperature Probe as a Blast Furnace Control Tool—ISS–AIME Reprint, pp. 1–8.
Accumetrix Brochure—Continuous Temperature Measurement System, pp. 1–5, Aug., 1993.
Contitherm—Heraus Brochure. Continuous Reading Molten Metal Temperature Sensor, May 1993, pp. 1–2.

*Primary Examiner*—Donald P. Walsh
*Assistant Examiner*—Chrisman D. Carroll

[57] ABSTRACT

An elongated protective device for an immersion pyrometer. The device comprises a self-supporting inner sheath made of a ceramic material having virtually no open pores and a protective, crack-free outer ceramic casing at least partially surrounding the inner sheath. The inner ceramic sheath has an interior cavity extending from an open end of the sheath internally to a closed end for receiving a thermocouple element. The thermocouple element is then positioned within the cavity with the hot junction of the thermocouple element contacting the closed end of the ceramic sheath. The device provides good corrosion, shock and oxidation resistance for pyrometers when immersed into molten metals and by-products at high temperatures.

17 Claims, 1 Drawing Sheet

PROTECTIVE CERAMIC DEVICE FOR IMMERSION PYROMETER

FIELD OF THE INVENTION

This invention relates to immersion pyrometers for measuring the temperature of molten metals or other high temperature fluids and, more particularly, to protective devices for protecting the temperature sensing thermocouple elements of such pyrometers against chemical attack.

BACKGROUND OF THE INVENTION

Most devices for protecting thermocouple elements of immersion pyrometers are made either of a metal, such as cast iron, stainless steel or molybdenum, which may be uncoated or coated with a ceramic layer (e.g. as disclosed in U.S. Pat. No. 4,721,533 issued Jan. 26, 1988 to Phillippi et. al.), or they are made of a fine-grained ceramic material, such as sintered alumina, magnesia or zirconia, or sintered mixtures of such materials with graphite (e.g. as disclosed in U.S. Pat. No. 5,209,571 issued May 11, 1993 to Kendall).

Protective devices made from non-refractory metals, such as cast iron, have low resistance to corrosion by molten metals and low resistance to oxidation. These low resistance levels can be increased by the provision of ceramic coatings, but such coatings are generally thin (no more than a few millimeters) and may peel away from the protective device during service. Protective devices made of refractory metals such as molybdenum have improved resistance to corrosion but these metals are much more expensive than non-refractory metals and still have low resistance to oxidation.

Fine-grained ceramic materials, such as sintered alumina and magnesia, are resistant to oxidation and may be resistant to corrosion by various molten metals. These characteristics, added to their low porosities, make these materials suitable for the protection of thermocouple elements against corrosion by molten metals in the presence of corrosive gases. However, such materials generally have a low mechanical strength and a poor resistance to thermal shocks. These disadvantages could, for some applications, be overcome by the use of sialons as the ceramic materials. However these fine-grained ceramics are expensive and their use is limited mainly to the non-ferrous industry since they have a poor resistance to corrosion by molten iron and steel.

Finally, none of the known protective devices permits a commercially feasible continuous temperature reading of molten iron or steel by means of an immersion pyrometer. In the ferrous industry, immersion pyrometers having a thermocouple element supported inside a cardboard sheath are mostly used at present. However, such thermocouple devices permit only one temperature measurement and must be replaced after each use. It will be appreciated that this is inconvenient and ultimately expensive.

SUMMARY OF THE INVENTION

It is an object of the present invention to provide a protective device for the temperature sensing element of an immersion pyrometer, which device resists corrosion by high temperature fluids such as molten metal and metal by-products, e.g. the slag present on top of the molten metal in steel induction furnaces and the skim present on the metal in aluminum holding furnaces.

It is another object of this invention to provide a protective device which also prevents corrosion of the thermocouple element of an immersion pyrometer by vaporous compounds which may be released from containers in which the molten metal and byproducts are held.

It is still another object of this invention to provide a protective device also having also a good thermal response which permits an immersion pyrometer to follow changes in the temperature of the above molten metal both rapidly and accurately.

It is yet a further object of this invention to provide a protective device also having a good mechanical strength, i.e. good abrasion and erosion resistance, and good thermal shock resistance.

According to one aspect of the present invention, there is provided an elongated protective device for an immersion pyrometer having an open end for receiving a thermocouple element and a closed end for immersion into the fluid to be measured. The protective device comprises a self-supporting elongated inner sheath made of a ceramic material of low porosity and a protective outer ceramic casing at least partially surrounding the inner sheath and intimately bonded to the inner sheath. The inner ceramic sheath has an interior cavity extending internally from the open end to near the closed end of the device.

The invention also relates to an immersion pyrometer including a protective device as defined above and to a process of producing the protective device.

In preferred forms of the invention, the protective device is composed of a ceramic outer casing which is bonded either chemically or mechanically to an inner ceramic sheath in such a way that no interfacial crack is observable between the inner sheath and the outer casing at 10×magnification. This means that there is no gap between the sheath and the casing into which fluid can penetrate during service to cause separation, spalling or splitting of the respective layers.

The outer casing and inner sheath cross-sections may be of any shape, but are most preferably circular. The preferred minimum wall thickness of the ceramic casing is about 1.5 cm and the preferred minimum wall thickness of the ceramic sheath is about 0.1 cm. Thinner wall thicknesses may, in some cases, permit damage to the protective device during use.

The outer casing is made of a suitable refractory castable ceramic having high strength and good resistance to thermal shocks, and also having good resistance to corrosion by the particular harsh molten metal environment likely to be encountered. Castable ceramics comprise a blend of refractory cementitious material which, when tempered with water, develop structural strength when cast in a mold or structural form (see the Dictionary of Ceramic Science and Engineering" by L. S. O'Bannon, Plenum Press, New York, USA, 1984). The castable refractory material used in the invention preferably contains refractory particles (made, for example, of alumina) and a bonding phase, e.g. a cement, such as calcium aluminate cement or phosphates. Castable refractories are well known in the fields of furnace and electrolytic cell manufacture and, subject to the reservation mentioned later, any one of a number of effective materials can be selected for use as the outer casing of the protective device of the present invention.

The inner sheath is preferably made of a fine grained ceramic material with essentially no open pores (less than 2% porosity and preferably about 0% porosity), that becomes chemically and/or mechanically bonded to the outer casing after a heat treatment. The inner sheath is open at one end and is closed at the opposite end and has an elongated internal cavity to permit the insertion of a thermocouple element whose hot junction is preferably placed in contact with the inner closed end of the inner sheath.

The outer casing may also be open at one end and closed at the other, but it is most preferably open at both ends, thus allowing the closed end of the inner sheath to project through the adjacent open end of the casing at the end of the device intended in service to be immersed in the high temperature fluid.

The thermocouple element itself is normally enclosed within an electrical insulator, such as for example a round double bore ceramic insulator, before being inserted into the internal cavity of the sheath. The space which remains in the cavity after the insertion of the electrically insulated thermocouple element may optionally be filled with ceramic powder or packing.

The immersion pyrometer assembly is completed by the installation of an electrical connector at the open end of the protective device.

It is an advantage of the present invention that the above-mentioned and other deficiencies of the known devices are alleviated or eliminated by the present protective device. The device of the invention can be used for intermittent or continuous temperature measurement for an extended period of time, immersed in a molten metal, such as, for example, molten steel or aluminum.

DETAILED DESCRIPTION OF THE INVENTION

Figure 1:
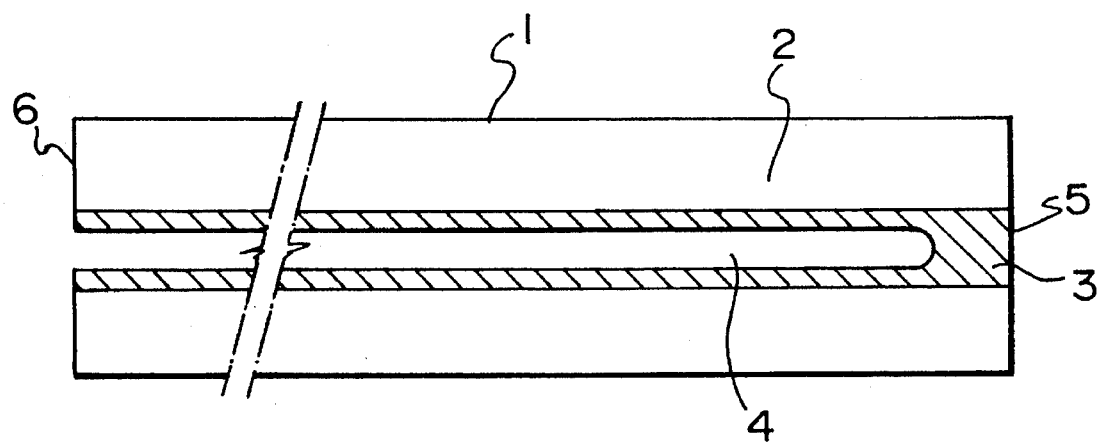
FIG. 1 is a longitudinal cross-sectional view of a device according to a preferred form of the present invention, showing the outer refractory casing and the inner ceramic sheath of the protective device.
Figure 2:
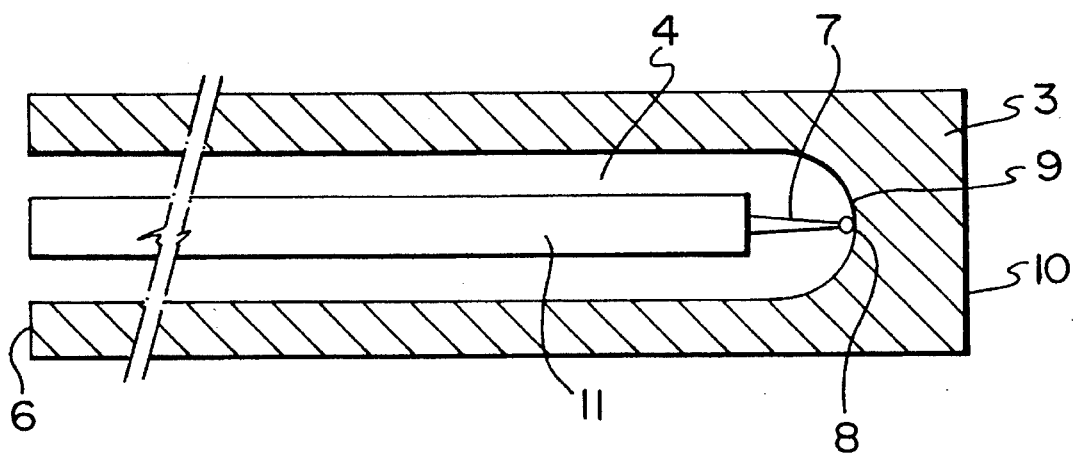
FIG. 2 is a longitudinal cross-sectional view similar to FIG. 1 but showing details of the inner ceramic sheath with a thermocouple element disposed therein.

To simplify the following description, it is assumed that the inner sheath and outer casing of the protective device shown in FIGS. 1 and 2 have a circular cross-section. Of course, this is not essential.

FIG. 1 is a longitudinal cross-sectional view of a protective device 1 of the invention having a self-supporting inner ceramic sheath 3 centered within an outer refractory casing 2. The sheath 3 encloses a thermocouple element (not shown in FIG. 1, but see element 7 in FIG. 2) positioned inside an internal cavity 4 of the sheath. The protective device has a closed end 5 and an open end 6.

The length of the protective device 1 is such that it can be immersed in molten metal or other hot fluid from the top or through a side wall of a container (e.g. a reverberatory furnace holding a quantity of molten metal and, usually, a layer of molten, non-metallic by-products). For most applications, this requires a protective device whose length is about 30 to 185 cm. The length of the outer refractory casing 2 is equal to the length of the protective device 1. The length of the inner ceramic sheath 3, whose closed end 5 penetrates the refractory casing 2 and, in service, directly contacts the molten metal, is at least equal to the immersion depth of the protective device into the molten metal alone, or the immersion depth in both the molten metal and the by-products. This depth is typically about 5 to 61 cm for most applications. For environments where protection of the thermocouple element against corrosion by vapor compounds is required, such as in steel induction furnaces where platinum-based thermocouple elements should be used, the length of the inner ceramic sheath should be equal to the length of the outer refractory casing. For environments where protection against corrosion by vapor compounds is not required, such as in aluminum holding furnaces where chromel-alumel thermocouple elements can be used, the inner ceramic sheath in the non-immersed zone of the protective device (with reference to the molten metal layer thickness or to the sum of the molten metal and by-products layer thicknesses) may be substituted by a cardboard cylinder (not shown) whose outer diameter is equal to the inner diameter of the inner ceramic sheath.

The outer diameter of the protective device 1, which may vary along its length (not shown in FIG. 1), is typically between 5 and 13 cm, and preferably between 5 and 8 cm. The difference between the outer and the inner diameters of the refractory casing 2, at any point along its length, is at least 3.0 cm and is preferably larger than 3.4 cm.

FIG. 2 is a longitudinal cross-sectional view of an inner ceramic sheath 3 alone which encloses an electrical insulator it positioned in the inner cavity 4. The insulator 11 itself contains a thermocouple element 7 whose hot junction 8 is in contact with an inner closed end 9 of the inner ceramic sheath. The cold junction of the thermocouple element (not shown) is positioned outside the open end 6 of the protective device. The inner ceramic sheath has a maximum outer diameter of 2 cm and a minimum inner diameter of 0.4 cm. These diameters, which are kept constant along the length of the ceramic sheath, preferably differ by at least 0.2 cm. Preferably, the outer and inner diameters of the ceramic sheath are between 1.0 and 1.5 cm, and between 0.5 and 0.8 cm, respectively. The outer closed end 10 of the ceramic sheath may be of any shape but preferably has a flat surface. The inner closed end 9 of the ceramic sheath may be of any shape but preferably has a curved surface. The distance between any point on the inner closed end 9 and any point on the outer closed end 10 of the ceramic sheath is preferably 0.2 to 1.5 cm, and more preferably 0.5 to 1.0 cm. The maximum diameter of the electrical insulator 11 is preferably 0.1 cm less than the inner diameter of the ceramic sheath.

For protective devices having an inner sheath and/or an outer casing with a non-circular cross-section, the above disclosed inner dimensions preferably refer to the diameter of the largest cylindrical geometry that can be put inside the corresponding material. Similarly, in such a case, the above disclosed outer dimensions refer to the diameter of the smallest cylindrical geometry that can be put around the corresponding material.

The inner ceramic sheath of the protective device can be made of any one of various ceramic materials, e.g. alumina, mullite, silicon nitride, sialon, zirconium oxide, magnesium oxide, silicon carbide and mixture thereof, and is preferably manufactured by extrusion of fine-grained powder (e.g. a powder made up of particles of minus 325 Tyler mesh, i.e. less than 40 microns) followed by sintering at a suitably high temperature. The open porosity of the ceramic sheath (e.g. as measured by British Standard B.S. 1902: Part 1A: 1966) is very low and should preferably be less than 2% and most preferably 0%. Such low porosity is important to prevent diffusion of vaporized compounds into the interior of the device where they might cause corrosion of the thermocouple element. The ceramic sheath should also preferably be made of such a material that it can develop bonds with the outer ceramic casing of the protective device during a heat treatment that will be described later.

A typical inner ceramic sheath for use in the present invention has a room temperature flexural strength (modulus of rupture) of at least 20 MPa and a thermal shock resistance of 100° C. (i.e. the minimum change of temperature where a sharp decrease in room temperature flexural strength is observed when samples are quenched into water from various elevated temperatures).

Any refractory castable material that is resistant to corrosion by the harsh molten environment encountered in the intended application (e.g. the molten metal and the molten by-products) can be used as the outer refractory casing of the protective device, provided:

(1) the material can develop bonds with the inner ceramic sheath of the protective device after a heat treatment, without cracking;

(2) the room temperature mechanical strength of the material after firing is suitably high, e.g. higher than 15 MPa; and (3) the thermal shock resistance of the material is suitably high, e.g. such that it resists at least 5 thermal cycles from 1030±10° C. to 25±5° C.

The protective device is preferably made in an appropriate mold by casting the outer refractory casing around the inner ceramic sheath centered within the castable material. The device is then allowed to cure inside the mold at room temperature for 8 to 48 hours, and preferably for 20 to 30 hours, and is then dried at 100° to 130° C. for 8 to 48 hours, and preferably for 20 to 30 hours, after been removed from the mold. Then the device is then heated for 3 to 24 hours, and preferably for 5 to 10 hours, at a soaking temperature which permits the required bonding between the inner sheath and the outer casing to be achieved. This temperature is a function of the type of refractory castable and inner sheath ceramic material used and is usually between 500° C. and the softening temperature of the refractory castable. When the firing temperature of the protective device is less than the mean operation temperature involved in the foreseen application, that implies that after the firing step, no interfacial crack can be observed under 10×magnifying optical microscopy between its inner sheath and outer casing, nor after its first subsequent firing to the mean operating temperature involved in that application.

The curing (drying) step disclosed in the above could be eliminated if a proper firing schedule is implemented prior to the achievement of the soaking temperature during the firing step. This requires that the mean heating rate from room temperature to 500° C. be less than 30° C./hr during the firing step.

Incidentally, while it has been stated that the inner ceramic sheath and the outer ceramic casing can each be made of a variety of materials, the desired crack-free bonding of the two layers is not always obtained with all of the possible combinations, although simple trial and experimentation coupled with microscopic observation can be used to determine the effective combinations. In general, the use of two materials that have an advantageous combination of differing thermal, mechanical, physical and chemical properties may be required.

It is, in fact, surprising that such crack-free bonding can be achieved at all with two dissimilar materials of the indicated types. Without wishing to be limited to a particular theory, it is surmised that the crack-free bonding is possible for one or more of the following reasons:

1) most of the differential thermal expansion between the two materials can be accommodated on firing by plastic deformation of the materials;

2) any remaining differential thermal expansion after plastic deformation produces stresses which do not exceed the strength of the refractory material;

3) the permanent linear shrinkage of the refractory material is low enough to permit maintenance of good contact between the two materials after firing, which implies that the interfacial strength (i.e. the bonding) between the two materials is high enough to withstand stresses induced by the refractory shrinkage on cooling;

4) the bonding phase (i.e. the cement) within the refractory material is able to link with the inner ceramic sheath, which implies that the two materials are chemically compatible.

The immersion pyrometer is formed by inserting an electrical insulator containing the thermocouple element, such as a preferably round double bore ceramic insulator, inside the cavity of the protective device, such that the hot junction of the element comes in contact with the inner closed end of the inner sheath. The space which remains in the cavity may or may not be filled with ceramic powder, such as alumina or magnesia. The immersion pyrometer assembly is then completed by the installation of an electrical connector at the open end of the protective device.

Examples of the procedures used for measuring the mechanical strength, thermal shock resistance and resistance to corrosion of the refractory castable material, as well as the method for characterizing its extent of bonding to the inner ceramic sheath of the protective device, are described in the following for the sake of completeness.

Three sample bars are first cast in a 23×6.4×5.4 cm mold and then allowed to cure at room temperature for 24 hours. Then the samples are removed from the mold and are dried at 120°±10° C. for 24 hours. Then these sample bars are fired for 5 hours at a soaking temperature equal to the mean operating temperature of the intended application. During this firing step, the heating and cooling rates of the samples are less than 100° and 50° C./hr, respectively. After firing, the 3 bars are submitted to 4-point bending to measure the mean mechanical strength of the material, according to standard practices. After bending, three cylindrical samples having a diameter of about 4.2 cm and a length of about 5 cm are core drilled from the broken bars to permit the thermal shock resistance measurements. Finally, some other of these broken bars are taken to make crucibles for pursuing the corrosion resistance measurements. These crucibles whose external dimensions are 10×6.4×5.4 cm contain a cylindrical cavity which is centered with respect to one of their 10×5.4 cm surface. The diameter of the cavity is 2.54 cm and its length is 3.81 cm.

For thermal shock resistance measurements, the above cylindrical samples are heated to 1030°±10° C. and then quenched in approximately 16000 to 17000 cm$^3$ of water, at 25°±5° C. When the samples are approximately the same temperature as the water, this heating and cooling cycle is repeated until the samples break in two pieces. The average maximum number of cycles obtained from the three samples is then recorded.

Resistance to corrosion of any refractory castables to a given molten harsh environment (i.e., molten metal or molten by-products) is considered to be achieved when a crucible made of that refractory material, according to the above procedures, does not show signs of penetration and/or dissolution to the naked eye on a mean thickness exceeding 2.5 cm, after being filled up to about ¾ of its cavity by the molten material and then heated for 5 hours at a soaking temperature equal to the mean operating temperature of the intended application.

Bonding between the inner ceramic sheath and the outer refractory casing of the protective device is considered to be achieved when no interfacial crack between these two materials can be observed at a magnification of 10× by optical microscopy, after subjecting the protective device to a heat treatment consisting of heating the device to a temperature between 500° C. and the softening temperature of the refractory castable employed, and then additionally heating the protective device at a temperature equal to the maximum operating temperature involved in the foreseen application, if the latter temperature is higher than the previous one.

Having thus described the invention, the following Examples and Comparative Example are given to illustrate the invention in more detail.

EXAMPLE 1

A protective device for an immersion pyrometer as defined in the present invention was made from an alumina inner ceramic sheath and a high alumina and low cement outer casing castable. This protective device permits the use of such immersion pyrometer in various applications, but only steelmaking furnaces where the mean operation temperature is 1650° C., and where the molten metal is surrounded on the top by a layer of molten slag, are considered in this Example.

The alumina ceramic sheath consisted of a cylinder having an open end and a closed end. The alumina content of the cylinder was higher than 99.5 percent by weight. The cylinder had no open pores. The inner and outer diameter of the cylinder were 0.635 and 0.952 cm, respectively, at every point along the length of the cylinder. The outer and the inner faces of the closed end of the cylinder had a flat and a curved surface, respectively. The minimum distance between these two surfaces was 0.635 cm. The cylinder was produced by the company Bolt Technical Ceramics of Conroe, Texas, U.S.A.

The refractory castable used to make the outer casing of the protective device was the product "HP-CAST ULTRA"(trademark) from the Narco company of Pittsburgh, Pa., U.S.A. This high alumina content (96.3 $Al_2O_3$) and low cement castable was formed and tested after firing at 1650° C., according to the procedures described in the present disclosure. The results are given in Table 1 below. The corrosion test was made only in molten slag since the latter is much more aggressive than molten steel. The composition of the slag used was the following (in wt. %):

| COMPONENT | % BY WEIGHT |
|---|---|
| FeO: | 28 |
| CaO: | 34 |
| $SiO_2$: | 14 |
| MgO: | 12 |
| $Al_2O_3$: | 6 |
| others: | 6 |

TABLE 1

Test results on "HP-CAST ULTRA"

| Mechanical strength | 31 MPa |
|---|---|
| Thermal shock resistance | 7 cycles |
| Corrosion resistance by molten slag | |
| • penetration | 2.1 cm |

TABLE 1-continued

Test results on "HP-CAST ULTRA"

| • dissolution | 0.5 cm |
|---|---|

The above castable was cast in a cylindrical mold around the alumina cylinder which was centered within the mold. The length of the mold was 30 cm. The inner diameter of the mold was 6 cm and was constant along its length. The protective device formed in this way, which had a geometry as shown in FIG. 1, was then submitted to the heat treatments described in the present disclosure, in which the firing temperature was 1650° C. As required, no cracking of the refractory castable resulted from the heat treatment. After firing, three diamond cuts were made across the diameter of the protective device at different positions along its length. The cross-sections so-produced were observed after polishing, under a magnification of 10× by optical microscopy. In each case, no crack was detectable at the interface between the alumina ceramic cylinder (inner sheath) and the refractory castable (outer casing).

EXAMPLE 2

A protective device for an immersion pyrometer as defined in the present invention was made from a mullite inner ceramic sheath and a 57 wt. % alumina and low cement outer casing castable.

The mullite ceramic sheath consisted of a cylinder having an open end and a closed end. The alumina content of the cylinder was about 70 wt. %. The cylinder had no open pores. The inner and outer diameter of the cylinder were 0.635 and 0.952 cm, respectively, at any point along the length of the cylinder. The outer and inner closed end of the cylinder had a flat and a curved surface, respectively. The minimum distance between these two surfaces was 0.635 cm. The cylinder was produced by the company Bolt Technical Ceramics.

The refractory castable used to make the outer casing of the protective device was the product "PLICAST SUPER HYMOR AL" (trademark) from the Narco company.

This product was cast in a cylindrical mold around the mullite cylinder which was centered within the mold. The length of the mold was 122 cm. The inner diameter of the mold was 6 cm and was constant along its length. The so-produced protective device whose geometry was as shown in FIG. 1, was then submitted to the heat treatments described in the present disclosure, where the firing temperature was 1000° C. No cracking of the refractory castable has resulted from that heat treatment. After firing, three diamond cuts were made across the diameter of the protective device, at different positions along its length. The cross-sections so-produced were observed after polishing, under a magnification of 10×by optical microscopy. In each case there was no crack detected at the interface between the mullite ceramic cylinder (inner sheath) and the refractory castable (outer casing).

COMPARATIVE EXAMPLE

The procedure of the above Example 1 was repeated except that the indicated refractory castable was replaced by a 93 wt. % alumina castable having a comparable coefficient of thermal expansion. All other parameters were kept constant during the fabrication of the protective device. After firing at 1650° C. and sectioning, no interfacial cracks were observed under 10× optical microscopy, but radial cracks were apparent to the naked eye in the refractory outer casing.

This shows that not all combinations of refractory castable and ceramic sheath material are effective in the invention and that trial and error, using microscopic observation, can determine the effective combinations.

What we claim is:

1. An elongated protective device for an immersion pyrometer having an open end for insertion of a thermocouple element and a closed end for immersion into a fluid whose temperature is to be sensed, said device comprising:

a self-supporting inner sheath made of a ceramic material of 0 to 2% porosity having an open end, a closed end having an outer closed end surface, outer sidewalls extending from said outer closed end surface to said open end and an elongated cavity extending internally from said open end to near said closed end for receiving a thermocouple element; and a crack-free protective outer ceramic casing covering said inner sheath, at least over said outer sidewalls of said inner sheath, formed from a uniform layer of a refractory castable material comprising a blend of refractory cementitious material particles and a bonding phase intimately bonded to said inner sheath by heating such that no interfacial crack is observable between the inner sheath and the outer casing when viewed at 10×magnification.

2. A device according to claim 1 wherein said inner sheath has a wall thickness of at least about 0.1 cm and said outer ceramic casing has a wall thickness of at least about 1.5 cm.

3. A device according to claim 1 wherein said closed end of said inner ceramic sheath has an internal surface that, in use, is contacted internally by a hot junction of a thermocouple element.

4. A device according to claim 1 wherein said ceramic casing does not cover said outer closed end surface of said inner sheath so that, in use, said outer closed end surface directly contacts said fluid whose temperature is to be measured.

5. A device according to claim 1 having a length of about 30 to 185 cm.

6. A device according to claim 5 wherein said inner sheath has a length of about 5 to 61 cm.

7. A device according to claim 1 further comprising a cardboard cylinder extending within said outer casing from said inner sheath to an open end of the device.

8. A device according to claim 1 wherein said inner sheath has a length that is about the same length as the device.

9. A device according to claim 1 wherein said inner sheath is made of a material selected from the group consisting of alumina, mullite, silicon nitride, sialon, zirconium oxide, magnesium oxide, silicon carbide and mixtures thereof.

10. A device according to claim 1 wherein said refractory castable material has a room temperature mechanical strength after firing greater than 15 MPa.

11. A device according to claim 1 wherein said refractory castable material has a thermal shock resistance after firing such that it resists at least 5 thermal cycles from 1030°±10° C. to 25°±5° C.

12. A device according to claim 1 wherein said castable refractory material is such that, after being formed around said sheath and subjected to heat-treatment, said material develops bonds to said sheath.

13. A thermocouple having a temperature sensing element enclosed within a protective device, said protective device comprising:

a self-supporting inner sheath made of a ceramic material of 0 to 2% porosity having an open end, a closed end having an outer closed end surface, sidewalls extending from said outer closed end surface to said open end and an elongated cavity extending internally from said open end to near said closed end for receiving a thermocouple element; and a crack-free protective outer ceramic casing covering said inner sheath at least over said outer sidewalls of said inner sheath, formed from a uniform layer of a refractory castable material comprising a blend of refractory cementitious material particles and a bonding phase intimately bonded to said inner sheath by heating such that no interfacial crack is observable between the inner sheath and the outer casing when viewed at 10×magnification.

14. A process of producing a protective device for a thermocouple element of an immersion pyrometer, comprising:

forming an inner sheath of ceramic material of 0 to 2% porosity, said sheath having an open end, a closed end having an outer closed end surface, outer sidewalls extending from said outer closed end surface to said open end and an elongated cavity extending internally from said open end to near said closed end for receiving a thermocouple element;

forming an outer protective casing around said inner sheath, at least over said outer sidewalls of said inner sheath, by casting a uniform layer of a refractory castable material comprising a blend of refractory cementitious material particles and a bonding phase;

heating said inner sheath and outer casing at an elevated temperature that causes an intimate bond to form between said outer casing and said inner sheath such that no interfacial crack is observable between the outer casing and the inner sheath when viewed at 10×magnification; and cooling said inner sheath and outer casing to form said protective device.

15. A process according to claim 14 wherein, before heating said inner sheath and outer casing, said casing is allowed to cure at ambient temperature for a period of about 8 to 48 hours.

16. A process according to claim 15 wherein said temperature that causes said bonds to form is between about 500° C. and a softening point of said refractory castable material.

17. A process according to claim 14 wherein said sheath and casing are heated at a mean heating rate from ambient temperature to said temperature which causes said bonds to form at a rate of less than 30° C./hr.

* * * * *